United States Patent
Podtburg et al.

(10) Patent No.: US 6,219,901 B1
(45) Date of Patent: Apr. 24, 2001

(54) OXIDE SUPERCONDUCTOR PRECURSORS

(75) Inventors: Eric R. Podtburg, Natick, MA (US); Kenneth H. Sandhage, Columbus, OH (US); Alexander Otto, Chelmsford, MA (US); Lawrence J. Masur, Needham, MA (US); Christopher A. Craven, Bedford, MA (US); Jeffrey D. Schreiber, Middleton, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 08/744,278

(22) Filed: Nov. 6, 1996

Related U.S. Application Data

(60) Division of application No. 08/102,561, filed on Aug. 5, 1993, which is a continuation-in-part of application No. 07/881,675, filed on May 12, 1992.

(51) Int. Cl.[7] .................................................. H01L 39/24

(52) U.S. Cl. .................... 29/599; 505/236; 505/500; 505/501; 505/510

(58) Field of Search ................... 29/599; 505/236, 505/300, 500, 501, 510

(56) References Cited

U.S. PATENT DOCUMENTS

| 4,824,826 | 4/1989 | Damento et al. |
| 4,826,808 | 5/1989 | Yurek et al. |
| 4,885,273 | 12/1989 | Sugimoto et al. |
| 4,962,084 | 10/1990 | deBarbadillo, II et al. |
| 4,965,245 | 10/1990 | Sugimoto et al. |

(List continued on next page.)

FOREIGN PATENT DOCUMENTS

| 0283313 | 9/1988 | (EP) |
| 0286521 | 10/1988 | (EP) |
| 0434372 | 6/1991 | (EP) |
| 63-248015 | 10/1988 | (JP) |
| 64-358187 | 2/1989 | (JP) |
| 01043911 | 6/1989 | (JP) |
| 01219019 | 9/1989 | (JP) |
| 4051412 | 2/1992 | (JP) |
| 230404 | 5/1991 | (NZ) |
| WO 92 13649 | 8/1992 | (WO) |

OTHER PUBLICATIONS

Tripathi et al. "Influence of silver and excess copper on the formation and properties of 2223 (Bi,Pb)–Sr–Ca–Cu–) superconductor" *J. Mater. Res.* 6(3), 455–458 (Mar., 1991).

"The Preparation of Superconducting $YBa_2Cu_3O_{7-y}$ /Ag Microlaminates by an Oscillating Oxidation Scheme" K.H. Sandhage *J. Electrochem. Soc.* 139(6), 1661–1670 (Jun. 1992).

"The Metallic Precurser Approach to Long Lenghts of $YBa_2Cu_3O_{7-y}$ Superconductor Wire" Sandhage et al. *High Temperature Superconducting Compounds III. Processing and Microstructure Property Relationships* New Orleans Feb. 17–21, 1991 Editor: Sung H. Whang et al. pp. 347–362.

"Oxidation of Bi(Pb)–Sr–Ca–Cu–Ag Metallic Precursors to Produce Oxide/Ag Superconducting Microcomposites" Gao et al. *J. Electrochem. Soc.* 137(6), 1951–1957–1670 (Jun. 1990).

(List continued on next page.)

*Primary Examiner*—Carl J. Arbes
(74) *Attorney, Agent, or Firm*—Clark & Elbing LLP; Mary Rose Scozzafava

(57) ABSTRACT

A composite for preparation of an oxide superconductor includes a primary alloy phase of constituent elements of a desired oxide superconductor; and a secondary phase comprising copper, the secondary phase supported by the primary alloy phase. The composite may additionally include a matrix material for supporting the primary alloy phase and second phase disposed therein. The composite is oxidized to form an oxide superconductor composite.

9 Claims, 6 Drawing Sheets

U.S. PATENT DOCUMENTS

| | | |
|---|---|---|
| 4,968,663 | 11/1990 | Whang . |
| 4,999,338 | 3/1991 | Wijeyeseksra et al. . |
| 5,034,373 | 7/1991 | Smith et al. . |
| 5,045,527 | 9/1991 | Ikeno et al. . |
| 5,063,200 | 11/1991 | Okada et al. . |
| 5,075,286 * | 12/1991 | Powell et al. .................... 29/599 X |
| 5,078,810 | 1/1992 | Tanaka et al. . |
| 5,104,849 | 4/1992 | Shiga et al. . |
| 5,132,278 | 7/1992 | Stevens et al. . |
| 5,149,683 * | 9/1992 | Wada et al. ........................ 505/500 |
| 5,168,127 | 12/1992 | Kohno et al. . |
| 5,232,908 | 8/1993 | Shiga et al. . |
| 5,259,885 | 11/1993 | Sandhage . |
| 5,283,232 | 2/1994 | Kohno et al. . |
| 5,296,456 | 3/1994 | Shiga et al. . |
| 5,627,141 * | 5/1997 | Hayashi et al. .................. 29/599 X |

OTHER PUBLICATIONS

Zhang et al. "Microstructure and properties of Cu–rich 123. Part I: Cooper at the grain boundaries" *J. Mater. Res.* 7(3), 572–579 (Mar., 1992).

Yang et al. "High $T_c$ superconductivity and microstructural control of Y–Ba–Cu–O by copper stoichiometry" *J. Crys. Growth* 91, 439–443 (Aug., 1988).

Pradhan et al. "Bismuth Strontium Calcium Copper Oxide high $T_c$ superconductors from nitrate solution" *Phys. Stat. Sol.* (a) 110, K93–96 (Dec., 1988).

Gao et al. "Textured BSCCO/Ag superconducting microcomposites with improved critical current density through mechanical deformation" *Superconducting Science and Technology* 5(5), 318–328 (May, 1992).

Otto et al. "High temperature superconducting wires made by the metallic precursor process" *JOM,* 48–52 (Sep., 1993).

Shin et al. "The effects of excess copper (II) oxide on the grain growth kinetics, sintering and microstructure of the yttrium, barium copper oxide ($YBa_2Cu_3O_{7-\delta}$) superconductor" [*Mater. Lett.* 15(1–2), 13–18 (Jan., 1992)]; CA 117:238544q (1992).

Higashiyama et al. "Preparation and characterization of yttrium barium copper oxide ($YBa_2 Cu_3 O_{7-\delta}$) films containing an excess amount of coipper by chemical vapor deposition" [*Jpn. J. Appl. Phys., Part 1* 30(6), 1209–1215 (Jun., 1991)]; Ca 115:83218u (1991).

Hamdi et al. "Grain growth of rapid–thermal–annealed yttrium barium copper oxide sueprconducting thin films" [*Appl. Phys. Lett.* 53(5), 435–437 (May, 1988)] CA 109:160819w (1988).

Li et al. "Effects of composition on microstructure and superconducting properties of $YBa_2Cu_3O_{7-x}$ thin films prepared by plasma enhanced metalorganic chemical vapor deposition" *Physica C* 195, 161–170 (May, 1992).

* cited by examiner

POWER MILLING

TUBE PACKING AND SEALING

DEFORMATION INTO HEXAGONAL ROD

REBUNDLING TUBE RE-PACKING AND SEALING

OXIDE SUPERCONDUCTOR PRECURSORS

This is a divisional of copending application Ser. No. 08/102,561 filed on Aug. 5, 1993.

This application is a continuation-in-part application of co-pending application U.S. Ser. No. 07/881,675 filed May 12, 1992, entitled "Strongly-Linked Oxide Superconductor and a Method of Its Manufacture".

FIELD OF THE INVENTION

The present invention relates to novel precursor materials for the preparation of high $T_c$ oxide superconductors and superconducting composites. The invention further relates to the use of the novel precursor materials in the preparation of oxide superconductors and superconducting composites.

BACKGROUND OF THE INVENTION

The discovery of high transition temperature superconducting oxides over the past six years triggered an international race to develop high temperature superconducting (HTS) materials. For many applications, in particular electrical power generation, the required HTS materials must operate at high current densities in magnetic fields, and possess adequate robustness, flexibility and critical current tolerance of strain. The stringent performance requirements of the HTS materials has demanded the development of new processing materials and techniques which impart improved superconducting and mechanical properties to the material.

Any improvements in material or process that can beneficially affect the superconducting and mechanical properties of the HTS material are highly desirable.

SUMMARY OF THE INVENTION

The object of the present invention is to provide novel composite materials useful in the preparation of oxide superconducting composites. The novel composite of the present invention exhibits reduced segregation of copper into the matrix metal phase and preferential growth of oxide superconductor phase, both of which have a beneficial effect on the superconducting properties of the oxide superconducting composite.

It is another object of the present invention, to provide a method for preparing composite materials as precursors and intermediates to oxide superconducting composites.

It is yet another object of the present invention to provide a method for preparing an oxide superconductor composite to improve the superconducting characteristics of the composite.

In one aspect of the invention, a composite of the invention includes a primary alloy phase containing constituent elements of a desired oxide superconductor and a secondary phase containing copper. The secondary phase is supported by the primary alloy phase.

"Alloy" is used herein in the conventional sense to mean an intimate mixture of phases or solid solution of two or more elements. An alloy can be prepared by milling, cooling from a melt or any other conventional means.

In a preferred embodiment, the constituent elements of the primary alloy phase and the copper of the secondary phase, in combination, are present in an amount sufficient to form the desired oxide superconductor. Excess or deficiency of a particular element is defined by comparison to the ideal copper cation stoichiometry of the desired oxide superconductor. In some embodiments, the elements may be present in the stoichiometric proportions of the desired oxide superconductor. In other embodiments, there may be a stoichiometric excess or deficiency of any constituent element to accommodate the processing conditions used to form the desired oxide superconductor. In preferred embodiments, copper is present in stoichiometric excess in the range of 10% to 30% with respect to the ideal copper cation stoichiometry of the desired oxide superconductor.

In preferred embodiments, a noble metal may also be present in the primary alloy phase and/or the secondary phase. Noble metals may include, among others, silver, gold, palladium and platinum.

The primary alloy phase supports the secondary phase. In one preferred embodiment, the support may be accomplished by disposing the secondary phase within the primary alloy phase. By "disposed within", as that term is used herein, it is meant that the secondary phase is embedded within the matrix material or substantially completely surrounded by the matrix material. The secondary phase preferably is in the form of a wire, rod, foil or particle.

In another preferred embodiment, the support is accomplished by contactingly surrounding at least a portion of an outer periphery of the primary alloy phase with the secondary phase. By "contactingly surrounding", as that term is used within, it is meant that at least one surface of the secondary phase is in contact with an outer periphery of the primary alloy phase. The secondary phase preferably is in the form of a wire, rod, foil or particle.

In one embodiment of the present invention, substantially all of the constituent element, copper, is in the secondary phase. In another embodiment of the present invention, a portion of the constituent element, copper, is the secondary phase and the balance of the copper needed to form an oxide superconductor is in the primary alloy phase.

In another aspect of the present invention, a composite of the invention includes a primary alloy phase containing constituent elements of a desired oxide superconductor, a secondary phase containing copper, the secondary phase supported by the primary alloy phase, and a matrix material for supporting a primary alloy phase and secondary phase disposed therein.

By "matrix", as that term is used herein, it is meant a material or homogeneous mixture of materials which supports and/or binds a substance disposed within or around the matrix.

In preferred embodiments, the matrix material is preferably a noble metal. The primary alloy phase and the secondary phase may also additionally comprise a noble metal. A noble metal is a material that is inert to chemical reaction and oxidation under the processing conditions used to form an oxide superconductor. Silver is a preferred noble metal.

In yet another aspect of the invention, an oxide composite includes a primary oxide phase comprising a sub-oxide of a desired oxide superconductor and a secondary silver phase disposed therein. By "sub-oxide", as that term is used herein, it is meant one or more oxides selected from the group consisting of simple, binary and higher oxides of the constituent elements of a desired oxide superconductor.

In yet another aspect of the invention, an oxide composite includes a primary oxide phase comprising a sub-oxide of a desired oxide superconductor, a secondary silver phase disposed therein and a matrix material for supporting a primary oxide phase and secondary silver phase therein.

In yet another aspect of the invention, an oxide superconductor is prepared by oxidation of composite including a primary alloy phase comprising an alloy of constituent elements of a desired oxide superconductor and a secondary phase comprising copper, the secondary phase supported by the primary alloy phase.

In yet another aspect of the invention, an oxide superconductor is prepared by oxidizing a composite including a primary alloy phase comprising an alloy of constituent elements of a desired oxide superconductor, a secondary phase comprising copper, the secondary phase supported by the primary alloy phase and a matrix material for supporting the primary alloy phase and secondary phase disposed therein.

In yet another aspect of the invention, a metal oxide/silver composite is prepared. A composite comprising a primary alloy phase comprising the constituent elements of a desired oxide superconductor and silver and a secondary phase comprising copper, the secondary phase supported by the primary alloy phase is prepared. The composite is oxidized under conditions sufficient to oxidize the constituent elements of a desired oxide superconductor and under conditions which promote the diffusion of the silver of the primary alloy phase into the region of the secondary phase and under conditions to promote the diffuision of the copper of the secondary phase into the region of the primary alloy phase, so that a pure silver phase occupying substantially the secondary phase is formed.

In another aspect of the invention, an oxide superconductor is prepared. A composite is prepared which includes a primary alloy phase comprising silver and the constituent elements of a desired oxide superconductor and a secondary phase comprising copper. The secondary phase supported by the primary alloy phase. The composite is oxidized under conditions sufficient to form an oxide superconductor.

In another aspect of the invention, an oxide superconductor is prepared. A composite is prepared which includes a primary alloy phase comprising silver and the constituent elements of a desired oxide superconductor, a secondary phase comprising copper and a matrix material. The secondary phase is supported by the primary alloy phase and the matrix material supports the primary alloy phase and the secondary phase disposed therein. The composite is oxidized under conditions sufficient to form an oxide superconductor.

DETAILED DESCRIPTION OF THE PREFERRED EMBODIMENT

Figure 1A:
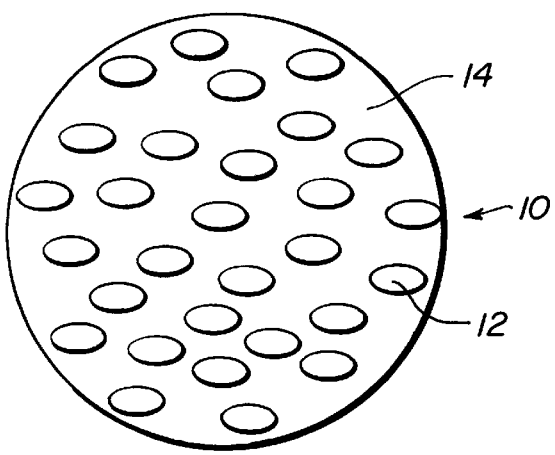
FIGS. 1(a)–(d) are cross-sectional views of several embodiments of the composite of the present invention.

The composite can take on many different geometric forms. For example, the primary alloy may be in the shape of a tape or a wire and the secondary form can be wires coaxially aligned within the primary alloy phase as shown in FIG. 1(a). A cross-sectional view of a composite 10 transverse to its longest dimension shows aligned copper wires 12 (secondary phase) disposed within a primary alloy phase 14. The copper wires 12 are coaxially aligned within the composite 10 and are of small dimension. There may be between 1 and 1000 copper wires disposed within the primary alloy phase.

Figure 1B:
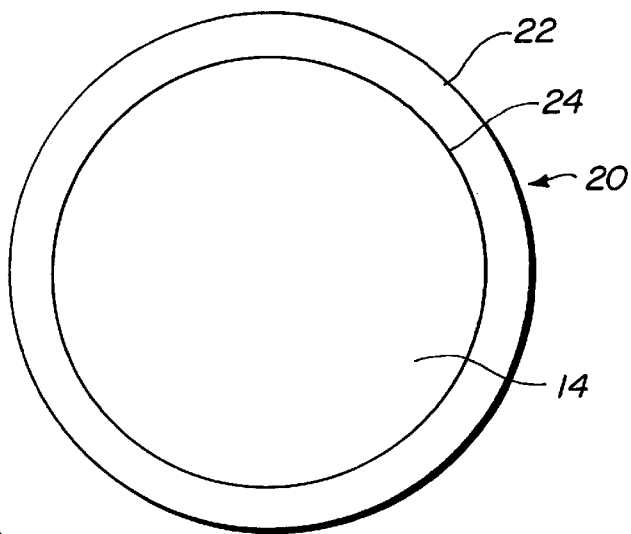
Figure 1C:
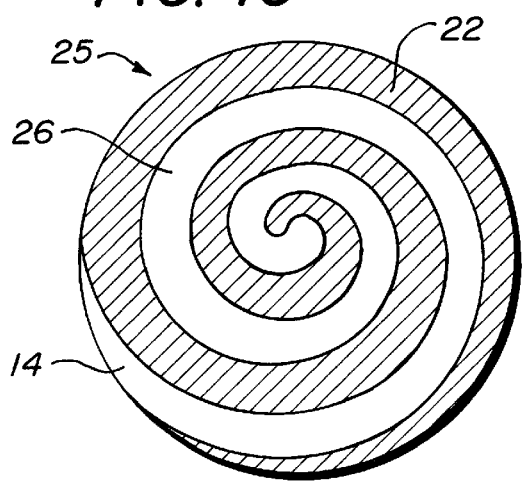

The secondary phase may also be in the form of a foil which surrounds an inner wire or tape of primary alloy phase. FIG. 1(b) shows a cross-sectional view of a composite 20 transverse to its longest dimension, in which a copper foil 22 (secondary phase) surrounds a primary alloy phase 14. The copper foil 22 surrounds at least a portion of an outer surface 24 of the primary alloy phase. The foil 22 is sufficiently contacted to the alloy surface to permit subsequent reaction between the phases, if desired. Alternatively, a foil 22 of the secondary phase could be rolled with a sheet 26 of primary alloy phase 14 to give a helices configuration as shown in FIG. 1(c).

Figure 1D:
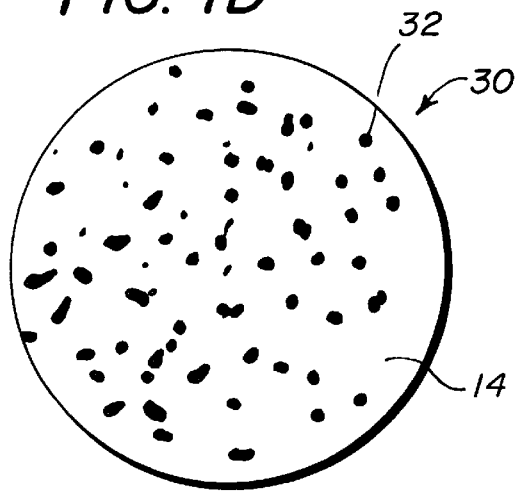

The secondary phase may be in the form of particles disposed throughout the primary alloy phase. FIG. 1(d) shows a cross-sectional view of a composite 30 which contains copper particles 32 (secondary phase) disposed within a primary alloy phase 14. The copper particles 32 have a particle size in the range of 100 $\mu$m or less and occupy an atomic fraction in the range of 0.05 to 0.65. The atomic fraction is dependent upon the desired oxide superconductor.

The primary alloy phase 14 may contain constituent elements of any oxide superconductor. For instance, yttrium (Y) and barium (Ba) for the Y—Ba—Cu—O family of oxide superconductors; bismuth (Bi), lead (Pb), strontium (Sr) and calcium (Ca) for the Bi—Sr—Ca—Cu—O family of oxide superconductors; thallium (Tl), Pb, Sr and Ca for the Tl—Sr—Ca—Cu—O family of oxide superconductors; and mercury (Hg), Pb, Sr and Ca for the Hg—Sr—Ca—Cu—O family of oxide superconductors. It may be preferable to have copper in stoichiometric excess in the range of 10% to 30% with respect to the cation stoichiometry of the desired oxide superconductor. Variations in the proportions and constituents of the elements comprising each oxide superconductor, as are well known in the art, are also within the scope and spirit of the invention.

The composite of the present invention can be prepared in any form, such as tapes, rods, ingots or sheets. The secondary phase may be evenly distributed throughout the primary alloy phase so that reaction time for the formation of the oxide superconductor can be minimized. Alternatively, the secondary phase may be grouped in a particular region, such as near the outer periphery of the primary phase or located in the center of the primary phase.

It is within the scope of the present invention for the constituent elements of the desired oxide superconductor to contain some, but not all, of the copper which makes up the desired oxide superconductor. The balance of the copper is found in the secondary phase. It is also within the scope of the invention for the alloy matrix 14 to contain additional elements other than the constituent elements of an oxide superconductor. For example, the alloy may contain a noble metal, such as silver.

In yet another embodiment, a matrix material supports the primary alloy phase and the secondary phase which is supported therein. It is contemplated that a plurality of primary alloy phase/secondary phase regions can be disposed within the matrix material. Matrix material include, but are in no way limited to, noble metals such as silver, gold, palladium and platinum.

The composites of the present invention may be prepared in the following manner.

EXAMPLE 1

A primary alloy phase is prepared by blending powders of the constituent elements of the desired oxide superconductor and silver. The blended powders are copper-deficient or may contain no copper, if desired. Silver comprises 70–80% vol of the blend. The resulting blend is then mechanically alloyed, as described, for example, in U.S. Pat. Nos. 4,962,084 and 5,034,373, herein incorporated by reference. The mechanically alloyed powder is fed into an extrusion die through which a plurality of copper wires is concurrently introduced. A composite wire is obtained having a primary alloy phase consisting of silver and copper-deficient, constituent elements of the desired oxide superconductor and a secondary phase of copper wires running coaxially along the length of the extruded wire.

EXAMPLE 2

A primary alloy phase is prepared, as described in Example 1 or using any conventional alloying technique, containing the elements Pb, Bi, Sr, Ca, Cu and Ag in the atomic ratio of 0.34:1.74:1.92:2.05:3.07:0 to 0.34:1.74:1.92:2.05:3.07:14.5. The alloy is heated to a temperature in the range of 450 to 700° C. in an inert atmosphere for 10 seconds or more to obtain a composite having copper regions disposed within the primary alloy phase.

EXAMPLE 3

Figure 2:
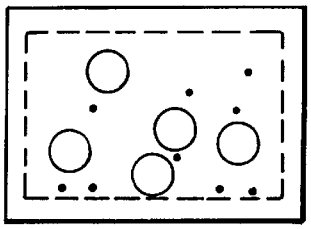
FIG. 2 is a flow diagram of the preparation of the composite of FIG. 1.
Figure 2:
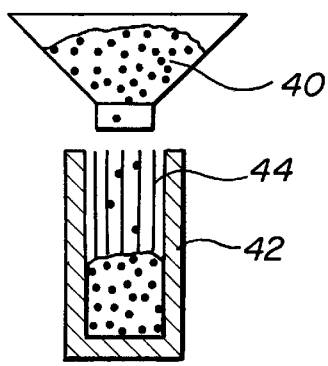
Figure 2:
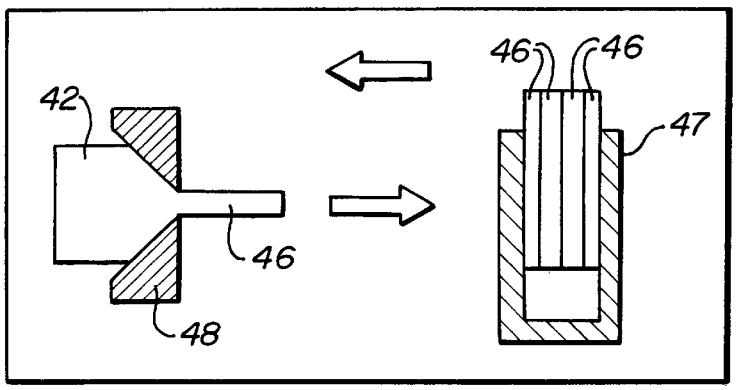
Figure 3:
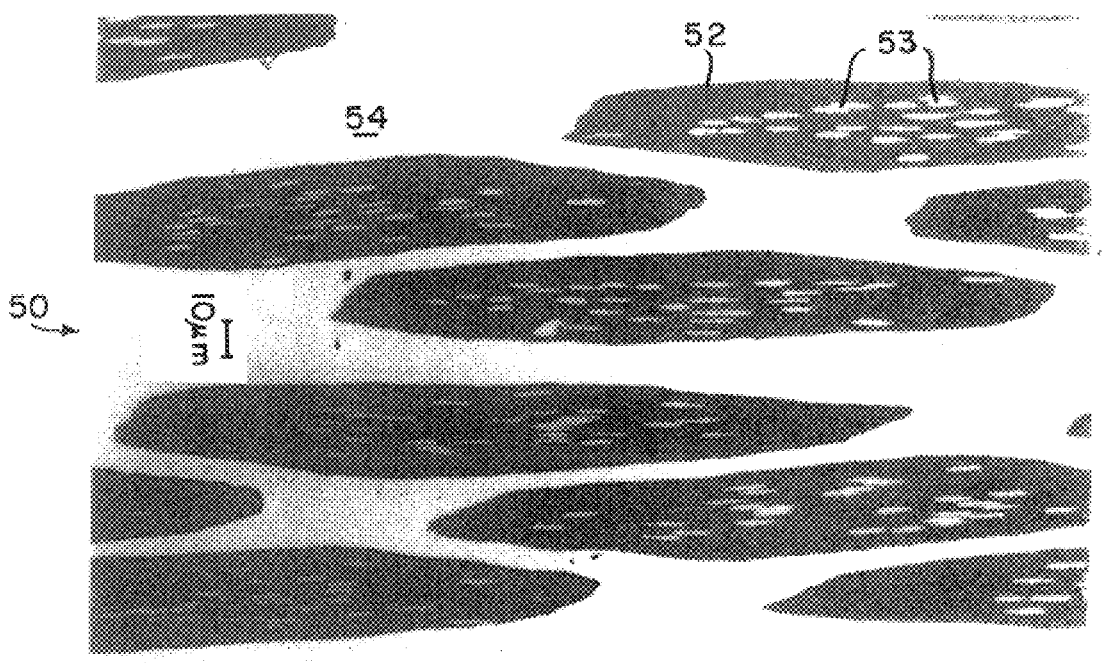
FIG. 3 is an optical photomicrograph of a cross-section of one embodiment of the present invention.

The process diagram in FIG. 2 illustrates the main elements of the process. The process begins with the mechanical alloying of metallic elements to form a homogeneous copper-deficient alloy powder 40 (primary alloy phase), as described above for Example 1. The alloy powder 40 is packed into a silver or copper can 42 (secondary phase) containing either a copper foil lining or strands of copper wire. FIG. 2 illustrates the process for an embodiment utilizing copper wires coaxially aligned within the silver or copper can 42. The silver or copper can 42 containing the powder alloy 40 and copper 42 is then sealed and extruded into a hexagonal rod 46. Cut pieces of the rod are stacked into a multi-rod bundle that is again packed into a silver or copper can 47 and extruded into a hexagonal rod. This process is repeated several times. In the final step, the can is extruded through a die 48 into a rectangular or round wire 46. Tapes between 200 and 3,000,000 filaments can be readily made using multiple stacking. FIG. 3 is an optical photomicrograph showing a cross-section of a multifilament wire 51 of the invention containing a primary alloy phase 52, a secondary copper phase 53 and a silver matrix material 54.

Figure 4:
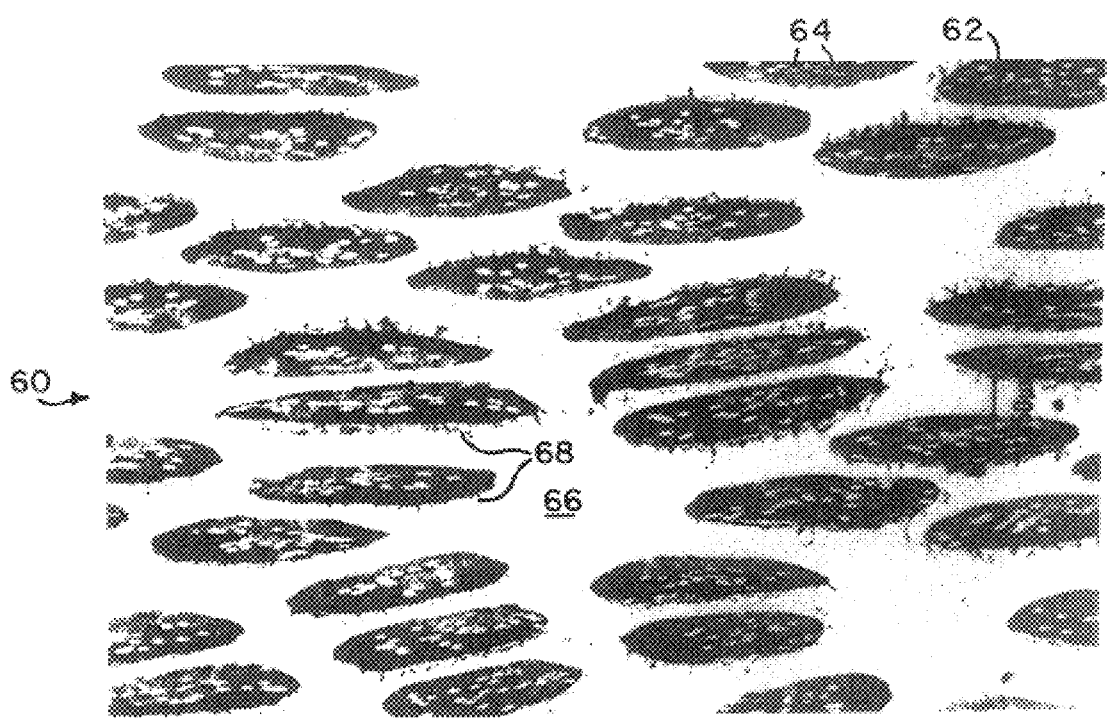
FIG. 4 is an optical photomicrograph of a cross-section of one embodiment of the present invention.

Another embodiment of the present invention includes an oxide composite which includes a primary oxide phase comprised of fully dense suboxides of a desired oxide superconductor and a secondary silver phase disposed within the primary oxide phase. In another embodiment, the composite includes a primary oxide phase and a secondary silver phase and a matrix material for supporting the primary oxide phase and secondary silver phase disposed therein. FIG. 4 is an optical photomicrograph of a cross-section of a wire 60 of this embodiment of the present invention having a primary alloy phase 62, a secondary silver phase 64 and a matrix material (here, silver) 66. Note that the composite is fully dense, that is, there are no visible porosity (gaps or voids) at grain boundaries (within phases) or at interfaces between phases. These microstructures are typical of composites prepared from oxidation of a precursor alloy and can be compared with composites prepared from powders of the sub-oxides, which are typically much less dense and have porosity within the phase and at phase interfaces.

The embodiment of FIG. 4 can be prepared as follows.

EXAMPLE 4

A multifilament composite is prepared according to Example 3. The composite is then oxidized under the conditions of 320 to 420° C. with oxygen pressures of 800 to 2000 psi ($O_2$) for 200 to 600 h, in particular, 420° C. for more than 200 h at 1600 psi ($O_2$). The process occurs as follows. Calcium and strontium are quickly oxidized to the corresponding metal oxides; bismuth and lead do not alloy significantly with copper and hence there is no significant migration of Ca, Pb, Sr or Bi into the copper secondary phase. The copper migrates towards the higher oxygen activity, i.e., out of the secondary phase and into the region of the primary alloy phase, thereby creating a void in the secondary phase. The void is displaced by silver due to the very high surface energy associated with the void.

EXAMPLE 5

A multifilament composite is prepared according to Example 3, with the following changes. The alloy powder 40 is alloyed with sufficient amount of copper to form a desired oxide superconductor and the copper wires 42 are replaced by silver wires. The assembled composite is oxidized under conditions sufficient to oxidize the alloy powder to suboxides. Typical oxidation conditions are 320° C. to 420° C. at 800 to 2000 PSi $O_2$ for 200 to 600 h.

Figure 5:
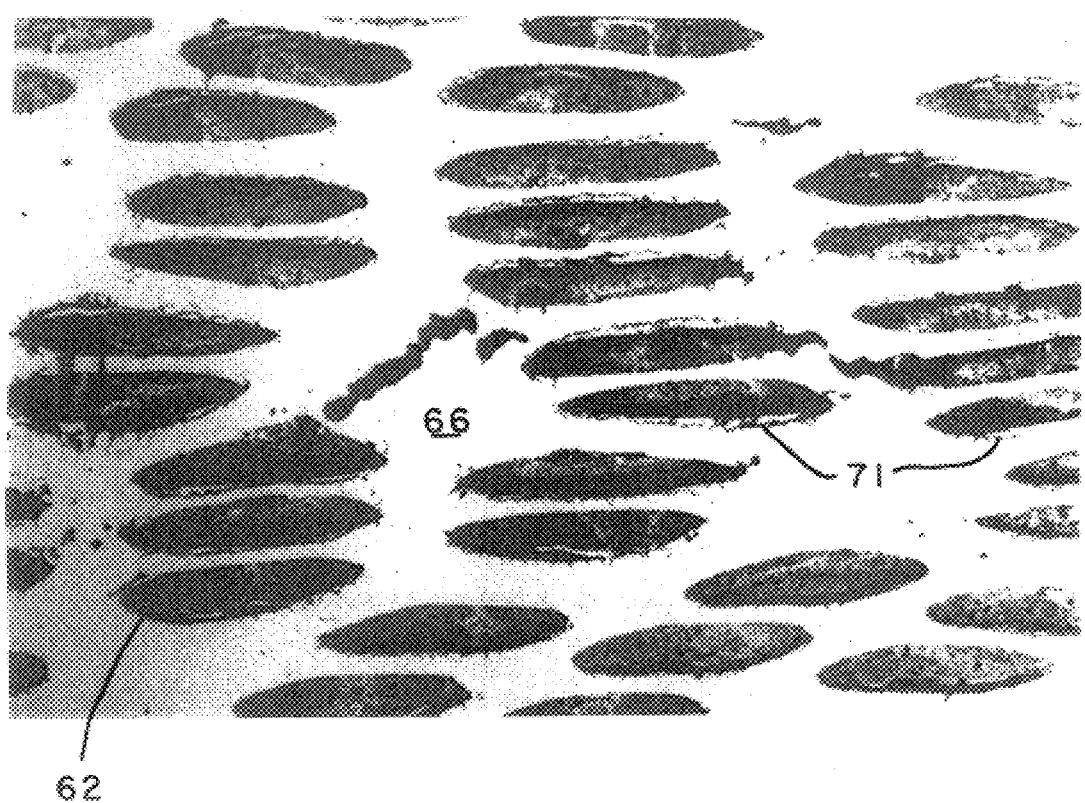
FIG. 5 is an optical photomicrograph of a cross-section of a metal oxide composite prepared from a precursor composite of the prior art.
Figure 6:
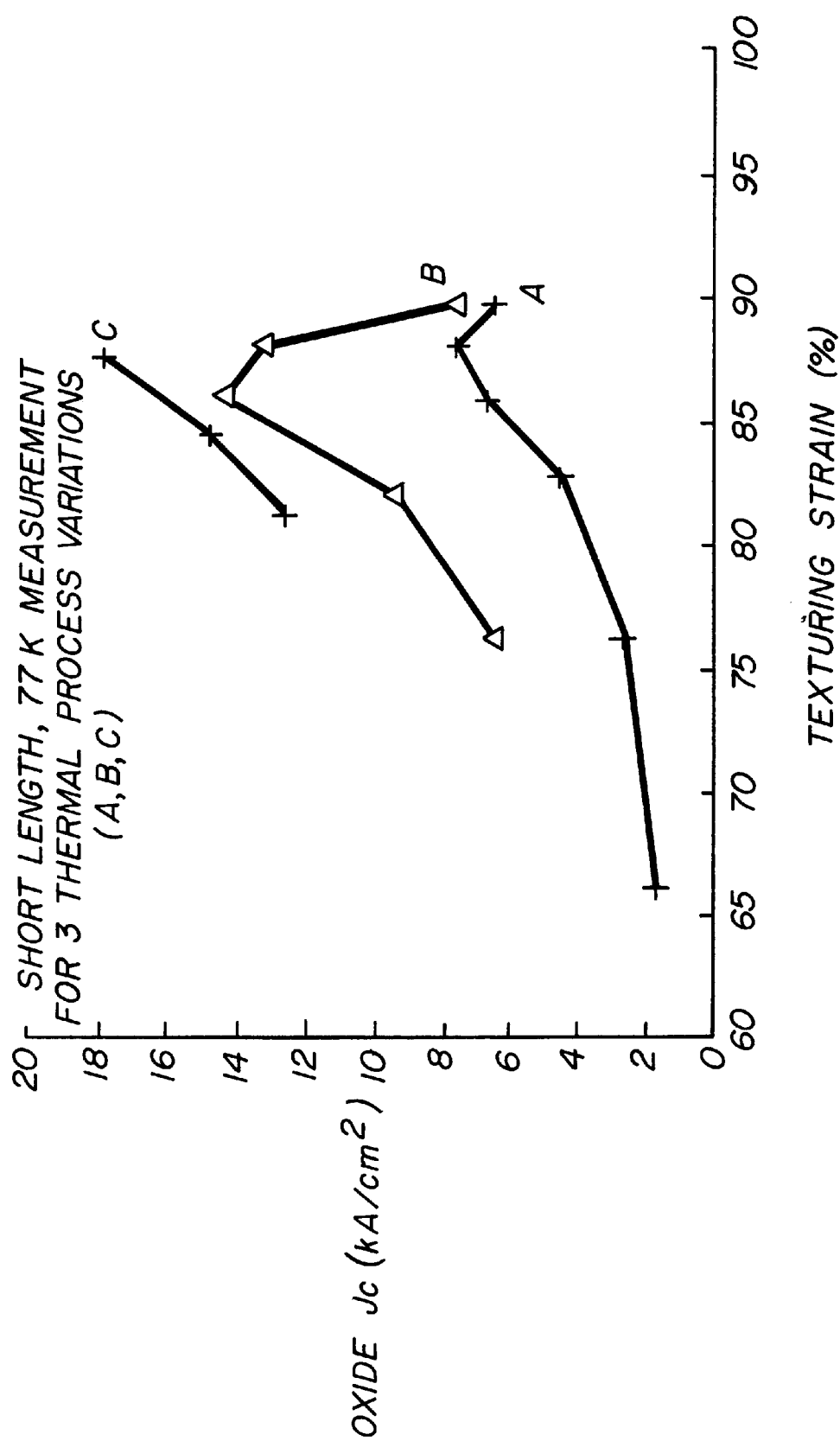
FIG. 6 is a graph of critical current density v. texturing strain, illustrating an aspect of the method of the present invention.

The precursor composite and the oxide composite of the present invention have several advantages. The composites exhibit reduced diffusion of copper into the matrix material upon oxidation of the composites to form an oxide superconductor. This can be demonstrated by comparison of the oxide composites in FIGS. 4 and 5. FIG. 4 represents an oxide composite which has been prepared from the oxidation according to the method of the invention of a precursor composite having a primary oxide phase supporting a copper wires (secondary phase) in a silver matrix FIG. 5 represents an oxide composite which has been prepared from a precursor composite without a secondary copper phase (copper is present in the primary alloy phase). Intrusion of the metal oxides, typically mostly copper oxide, although oxides of other metals can also form, into the silver matrix occurs to varying extent in both composites. However, metal oxide intrusion (which appears as fine tendrils 68 of metal oxide) is severely restricted in FIG. 4 compared to the two-dimensional front 70 of intruded metal oxide shown in FIG. 5. The two-dimensional "halo" of metal oxide surrounding the sub-oxide phase of the composite represents a much larger proportion of the constituent elements that the linear tendrils of FIG. 4. The oxide intrusion into the silver matrix remains upon further heat treatment to form an oxide superconductor.

Further, the concentration of silver in the secondary phase of the oxide composites of the present invention provides an interface capable of preferential growth of the oxide superconductor. There has been suggestions in the prior art that silver/oxide interfaces promote the oriented growth of oxide superconductor grains, leading to texturing and improved critical transport characteristics (see, Feng et al. in *Appl. Phys. Lett.*, 1993, hereby incorporated by reference).

The compositions disclosed above can be used in the preparation of oxide superconducting composites. The composition may include the superconducting oxide phase including, but not limited to $Bi_{2-y}Pb_4Sr_2Ca_2Cu_{3+z}O_x$, where x is sufficient to provide $T_c \geq 90$ K, and $0 \leq y \leq 0.6$ and $0 \leq z \leq 1.0$, $Bi_{2-y}Pb_4Sr_2Ca_2Cu_{3+z}O_x$, where x is sufficient to provide $T_c \geq 77$ K, and $0 \leq y \leq 0.6$ and $0 \leq z \leq 0.3$ and $A_nBa_{2n}Cu_{a(3n+1)}O_x$, where $A=(Re_{1-y}Ca_y)$, $n=(1, 2, 3 \ldots \infty)$, $a=(1.0-1.3)$ and $0 \leq y \leq 0.2$ and x is sufficient to provide $T_c \geq 65$ K Re here is a rare earth or yttrium. It may be preferable to have excess copper in the oxide superconductor in the range of 10 to 30% excess based on the ideal copper cation stoichiometry of the oxide superconductor. Such compositions include, but are not limited to compositions having the following cation stoichiometries: $Bi_{2-y}Pb_ySr_2Ca_2Cu_{3.5-3.7}$; $Bi_{2-y}Pb_ySr_2Ca_1Cu_{2.3-2.6}$; and $A_1Ba_2Cu_{4.6-5.2}$.

The preparation of oxide superconducting composites using the composites and oxide composites of the present invention are described.

EXAMPLE 6

A primary alloy phase is prepared by blending the elements of Pb, Bi, Sr, Ca and Ag in the atomic ratio of 0.34:1.74:1.92:2.05:14.5. The resulting blend is then mechanically alloyed, as described, for example, in U.S. Pat. No. 5,034,373, herein incorporated by reference.

Thirty three fine copper wires (0.5 mm in diameter) are coaxially arranged within a silver billet 0.615 inches OD×0.552 inches ID×5.0 inches long (matrix material) and the alloyed powder containing Pb, Bi, Sr, Ca and Ag is packed into the billet and around the copper wires. The material within the silver billet has a final composition of 0.34 Pb:1.74 Bi:1.92 Sr:2.05 Ca:3.07 Cu:14.5 Ag. The silver billet was extruded through a die to provide a composite wire having a silver matrix and plurality of primary alloy phase regions, each region supporting a secondary phase of copper wires.

A plurality of wires prepared as described in the preceding paragraph are bundled together and coextruded to obtain a multifilament wire. An optical photomicrograph of a typical multifilament wire prepared from the composite of the present invention is shown in FIG. 3.

The multifilament wire is then oxidized at 420° C. for 288 h in 100 atm oxygen. Under these oxidizing conditions, the copper diffuses out of the secondary phase and into the primary alloy phase. Concurrently, the silver of the primary alloy phase migrates towards the regions of the secondary phase to be concentrated in the secondary phase, thereby forming a metal oxide/silver composite. The oxide composite sample is further heat treated in 0.075 atm $O_2$ for a total time of 7 to 15 h at a temperature of 780° C. with intermediate deformations through rolling of 75% to 82% strain. The temperature was increased to 831° C. for a further 10 to 60 h in 0.075 atm $O_2$ and then deformed a further 16 to 20% strain for a total strain in the range of 80 to 85%. A final heat treatment at 830° C. for 60 h and then 811° C. for 180 h provides a $Bi_{2-y}Pb_ySr_2Ca_2Cu_3O_x$ oxide superconductor, where y is $0 \leq y \leq 0.6$. The critical current densities of samples prepared according to this method are given in Table 1.

EXAMPLE 7

A precursor alloy is prepared and processed in the manner described in Example 6 above, with the following exception. Copper is mechanically alloyed with the other constituent elements of the oxide superconductor. No copper secondary phase is used. The elements of Pb, Bi, Sr, Ca, Cu and Ag in the atomic ratio of 0.34:1.74:1.92:2.05:3.07:14.5. The resulting blend is then mechanically alloyed. The precursor alloy is processed as described in Example 1. A $Bi_{2-y}Pb_ySr_2Ca_2Cu_3O_x$ oxide superconductor is obtained, where $0 \leq y \leq 0.6$. The critical current densities of wire samples prepared according to this method are given in Table 1.

EXAMPLE 8

A precursor alloy is prepared by blending the elements of Pb, Bi, Sr, Ca and Ag in the atomic ratio of 0.34:1.74:1.92:2.05:14.5. Thirty three fine copper wires (0.5 mm in diameter) are coaxially arranged within a silver billet the alloyed powder containing Pb, Bi, Sr, Ca and Ag is packed into the billet and around the copper wires. The material within the silver billet has a final composition of 0.34 Pb:1.74 Bi:1.92 Sr:2.05 Ca:3.70 Cu:14.5 Ag. The precursor composite is processed and thermally treated as described in Example 6. The critical current densities of wire samples prepared according to this method are given in Table 1.

EXAMPLE 9

A precursor alloy is prepared by blending the elements of Pb, Bi, Sr, Ca, Cu and Ag in the atomic ratio of 0.34:1.74:1.92:2.05:3.52:14.5. The alloyed powder containing Pb, Bi, Sr, Ca, Cu and Ag is packed into a silver billet. The material within the silver billet has a final composition of 0.34 Pb:1.74 Bi:1.92 Sr:2.05 Ca:3.52 Cu:14.5 Ag. The precursor composite is processed and thermally treated as described in Example 6. The critical current densities of wire samples prepared according to this method are given in Table 1.

TABLE 1

Comparative Critical Current Densities for Examples 6–9

| No. | total strain (%) | t (hour)[a] 1 | 2 | 3 | $J_c$ (A/cm$^2$) |
|---|---|---|---|---|---|
| 6 | 80 | 20 | 60 | 180 | 8770 |
| 6 | 85 | 20 | 60 | 180 | 9160 |
| 7 | 80 | 20 | 60 | 180 | 5100 |
| 7 | 85 | 20 | 60 | 180 | 6440 |
| 8 | 85 | 20 | 60 | 120 | 7160 |
| 8 | 85 | 20 | 60 | 120 | 5410 |
| 9 | 85 | 20 | 60 | 120 | 3830 |

[a]1 = heat treatment at 831° C. followed by deformation; 2 = heat treatment at 831° C. 3 = heat treatment at 811° C. followed.

Table 1 clearly shows that excess copper levels in the oxide superconductor composite, and the presence of a secondary copper phase contribute to higher critical current densities in the sample. What is further clear is that these process parameters are process independent in that the parameters, alone and in combination, improve $J_c$. Further visual examination of the oxide superconducting samples prepared from the composite of the present invention show reduced segregation of copper into the silver matrix. This is supported by comparison of oxide composites of FIGS. 3 and 4.

The nature of the deformation and anneal conditions can also have an effect on the final superconducting properties of the composite as shown in the example below.

EXAMPLE 10

A multifilamentary composite wire is prepared as follows.

A precursor alloy is prepared by blending the elements of Pb, Bi, Sr, Ca and Ag in the atomic ratio of 0.34:1.74:1.92:2.05:14.5. The resulting blend is then mechanically alloyed, as described, in Examples above. The alloyed powder containing Pb, Bi, Sr, Ca and Ag is packed into the billet and around the copper wires. The material within the silver billet has a final composition of 0.34 Pb:1.74 Bi:1.92 Sr:2.05 Ca:3.80 Cu:14.5 Ag. The silver billet was extruded through a die to provide a composite wire with a hexagonal cross-section. A plurality of wires thus prepared are bundled together and coextruded to obtain a multifilament wire and extruded to provide a precursor tape or wire.

Following precursor tape manufacture, the alloy filaments are oxidized to form fine grained, dispersed sub-oxide phases by diffusing oxygen through the silver matrix, exploiting silver's high permeability to atomic oxygen.

Following oxidation, the precursor oxide filaments are reacted by thermal treatment(s) to form highly aspected, superconducting oxide grains with the c-directions orthogonal to their large surfaces. The reaction path for $Bi_{2-y}Pb_ySr_2Ca_2Cu_{3+z}O_x$ (Bi-2223) involves the well known initial formation of Bi-2212 and "0011" reactant (compositionally $CaCuO_2$) from the suboxide phases, reaction (1), followed by conversion to Bi-2223, reactions (2), via an intercalation mechanism that reproduces the texture of the $Bi_{2-y}Pb_ySr_1Ca_2Cu_{2+z}O_x$ (Bi-2212) phase assemblage in the Bi-2223 phase assemblage formed.

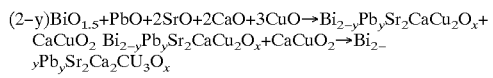

Both the Bi-2212 and Bi-2223 phases are textured by deformation processes such as rolling or uniaxial pressing. The oxide composite sample is further heat treated in 0.075 atm $O_2$ for a total time of 7 to 15 h at a temperature of 780° C. with intermediate deformations through rolling of 75% to 85% strain. The temperature was increased to 830° C. for a further 20 h in 0.075 atm $O_2$ and then deformed a further 16 to 25% strain and heated treated for 60 hours at 830° C. in 7.5% $O_2$ and then finally heat treated at 811° C. for 180 h.

The deformation used to texture the superconducting phase also fractures the oxides into discrete particles. The superconducting phase is therefore sintered by a final thermal treatment to form the interconnected structure inside each filament required for supercurrent transport through the multifilament composite.

The oxide Jc dependencies on text strain are illustrated in FIG. 5, for three thermal processing variations. It is evident that Jc typically increases with increasing texturing strain to a maximum in the range of 82% to 89% strain, followed by a rapid decrease. The increase in Jc as strain increases is due to improved texture, and the decrease is due to damage in the filaments from strain localization.

Thermal process variations improve Jc by enhancing texturing strain efficacy as seen by the overall upward shift of the Jc v. strain relations for three thermal process variations. The optimal texturing strains in the range of 82 to 89% are small in comparison to the total strain (>99%) required to fabricate a multifilament tape. These total texturing strains are achieved by one or more deformation step wherein a deformation step is one or more applications of force to be the material between thermal treatments. The bulk of the deformation required for making high Jc multifilament wires in the process can therefore be done with the precursor filaments in the ductile metallic state, rather than in the more brittle oxide state.

The transport properties attained with high-filament-count precursor composite processed tapes are presented in Table 2.

TABLE 2

Transport properties of 259 filament, Bi-2223 - silver composite tapes made from precursors composites

| Length (m) | Temperature (K.) | Oxide Jc[1] (A/cm$^2$) |
|---|---|---|
| 0.03 | 77 | 17,700 |
| 0.03 | 4.2 | 71,000 |
| 8 | 77 | 8,000 |

[1]Jc is measured with the 1 $\mu$V/cm criterion (DC) by the four point probe method.

The 77 K short length oxide Jc level in Table 2 exceeds the best levels reported for any other filament count process. Further more, these tapes were textured by scalable processes such as rolling, allowing extension of the process to long lengths.

Other embodiments of the invention will be apparent to those skilled in the art from a consideration of the specification or practice of the invention disclosed herein. It is intended that the specification an examples be considered as exemplary only, with the true scope and spirit of the invention being indicated by the following claims.

What is claimed is:

1. A process for preparing an oxide superconductor composite, comprising:
   (i) preparing a precursor composite comprising,
      (a) a primary alloy phase comprising a portion of the metallic constituent elements of an oxide superconductor and noble metal, said primary phase deficient in copper; and
      (b) a secondary phase comprising copper, said secondary phase positioned in intimate contact with the primary alloy phase to permit exchange of elements between the phases,
         wherein the constituent elements of the primary alloy phase and the copper of the secondary phase are, in combination, present in an amount sufficient to form the oxide superconductor;
   (ii) heating the composite under a first oxygen partial pressure and temperature selected to diffuse copper of the secondary phase into the region occupied by the primary alloy phase, to diffuse the noble metal of the primary alloy phase into the region occupied by the secondary phase and to convert the constituent metallic elements of the alloy phase into metal oxides, so that a metal oxide phase in intimate contact with a secondary phase, said secondary phase comprised substantially of noble metal, is obtained; and
   (iii) heating the metal oxide/noble metal composite at a second selected oxygen partial pressure and temperature to form an oxide superconductor/noble metal composite.

2. A process for preparing an oxide superconductor composite, comprising:
   (i) preparing a precursor composite comprising,
      (a) a primary alloy phase comprising a portion of the metallic constituent elements of an oxide superconductor and noble metal, said primary phase deficient in copper; and (b) a secondary phase comprising copper, said secondary phase positioned in intimate contact with the primary alloy phase to permit exchange of elements between the phases,
    wherein the constituent elements of the primary alloy phase and the copper of the secondary phase are, in combination, present in an amount sufficient to form the oxide superconductor; and
(c) a noble metal matrix material within which the primary alloy phase in intimate contact with the secondary phase are disposed;

(ii) heating the composite under a first selected oxygen partial pressure and temperature selected to diffuse copper of the secondary phase into the region occupied by the primary alloy phase, to diffuse the noble metal of the primary alloy phase into the region occupied by the secondary phase and to convert the constituent metallic elements of the alloy phase into metal oxides, so that a metal oxide phase in intimate contact with a secondary phase, said secondary phase comprised substantially of noble metal, is obtained, said metal oxide phase in intimate contact with said secondary phase disposed within said noble metal matrix; and (iii) heating the metal oxide/noble metal composite at a second oxygen partial pressure and temperature selected to form an oxide superconductor/noble metal composite.

3. The process of claim 1 or 2, wherein preparing the precursor composite comprises:

preparing an primary alloy comprising the constituent elements of an oxide superconductor, said primary alloy phase including copper; and heating the alloy at a temperature in the range of 450 to 700° C. in an inert atmosphere for 10 or more seconds to phase separate the copper from the primary alloy, to thereby obtain a primary alloy phase deficient in copper and a secondary phase comprising copper.

4. The process of claim 1 or 2, wherein the condition sufficient to promote the diffusion of the copper of the secondary phase into the region occupied by the primary alloy phase, to oxidize the constituent metallic elements of the oxide superconductor to metal oxides and to promote the diffusion of the noble metal of the primary alloy phase into the region occupied by the secondary phase comprises oxidation in an oxygen pressure of 800 to 3000 psi with a total pressure of 801 to 60,000 psi.

5. The process of claim 1 or 2, wherein the heating step comprises heating at a temperature in the range of 700 to 860° C. at a total pressure in the range of 0.9 to 1.1 atm with gas comprising 7.5% to 22% oxygen and the balance nitrogen.

6. The process of claim 1 or 2, further comprising the step of:

texturing the oxide superconductor composite by subjecting the oxide superconducting composite to at least one deformation and anneal step, wherein the total deformation is in the range of 82% to 89% strain and wherein the anneal step comprises conditions sufficient to form the oxide superconductor.

7. The process of claim 1 or 2, wherein the precursor composite is prepared by:

providing a secondary phase comprising copper in a form selected from a group consisting of particle, foil, wire and rod;

positioning the secondary phase within a noble metal sheath; and introducing the primary alloy into the noble metal sheath.

8. The method of claims 1 or 2, wherein substantially all of the copper of the composite is present in the secondary phase.

9. The process of claim 1 or 2, wherein the precursor composite is prepared by:

providing a secondary phase comprising copper in a form selected from a group consisting of particle, foil, wire and rod.

* * * * *